United States Patent
Yeom et al.

(10) Patent No.: US 11,120,975 B2
(45) Date of Patent: Sep. 14, 2021

(54) ION BEAM ETCHING APPARATUS

(71) Applicant: Research & Business Foundation Sungkyunkwan University, Suwon-si (KR)

(72) Inventors: Geun Young Yeom, Seoul (KR); Jin Woo Park, Goyang-si (KR); Doo San Kim, Suncheon-si (KR); Jong Sik Oh, Suwon-si (KR); Da In Sung, Daejeon (KR); You Jin Ji, Gunpo-si (KR); Won Oh Lee, Hwaseong-si (KR); Mu Kyeom Mun, Uiwang-si (KR); Kyung Chae Yang, Anyang-si (KR); Ki Seok Kim, Incheon (KR); Ji Soo Oh, Suwon-si (KR); Ki Hyun Kim, Daejeon (KR)

(73) Assignee: Research and Business Foundation Sungkyunkwan University, Suwon-si (KR)

( * ) Notice: Subject to any disclaimer, the term of this patent is extended or adjusted under 35 U.S.C. 154(b) by 418 days.

(21) Appl. No.: 16/046,029

(22) Filed: Jul. 26, 2018

(65) Prior Publication Data
US 2019/0035610 A1    Jan. 31, 2019

(30) Foreign Application Priority Data
Jul. 27, 2017   (KR) .................. 10-2017-0095219

(51) Int. Cl.
*H01J 37/32*   (2006.01)
*H01L 21/67*   (2006.01)

(52) U.S. Cl.
CPC .... *H01J 37/32834* (2013.01); *H01J 37/3244* (2013.01); *H01J 37/32357* (2013.01);
(Continued)

(58) Field of Classification Search
None
See application file for complete search history.

(56) References Cited

U.S. PATENT DOCUMENTS 5,352,902 A * 10/1994 Aoki ................... C23C 16/4412
                                                                250/492.2
5,433,238 A *  7/1995 Cannizzaro ......... C23C 16/4412
                                                                137/14
(Continued)

*Primary Examiner* — Jason Berman
(74) *Attorney, Agent, or Firm* — NSIP Law

(57) ABSTRACT

An ion-beam etching apparatus includes: a plasma chamber configured to generate plasma from process gas in the plasma chamber; at least one plasma valve coupled to the plasma chamber; an ion-beam source in communication with the plasma chamber, wherein the ion-beam source is configured to extract ions from the plasma and generate ion-beams when a bias is applied to the ion-beam source; an etching chamber in communication with the ion-beam source, and configured to accommodate an object to be etched; at least one etching valve coupled to the etching chamber; and at least one exhausting pump connected to either one or both of the plasma chamber and the etching chamber by the plasma valve and the etching valve, respectively, wherein the at least one exhausting pump is configured to receive and exhaust radicals in either one or both of the plasma chamber and the etching chamber by the plasma valve and the etching valve, respectively.

13 Claims, 7 Drawing Sheets

(52) U.S. Cl.
CPC .. *H01J 37/32422* (2013.01); *H01J 37/32449* (2013.01); *H01J 37/32651* (2013.01); *H01J 37/32816* (2013.01); *H01L 21/67028* (2013.01); *H01L 21/67069* (2013.01); *H01J 2237/186* (2013.01); *H01J 2237/3341* (2013.01); *H01J 2237/3345* (2013.01)

(56) References Cited

U.S. PATENT DOCUMENTS

| | | | | |
|---|---|---|---|---|
| 5,788,825 | A * | 8/1998 | Park | C23C 14/564 204/298.07 |
| 6,238,582 | B1 * | 5/2001 | Williams | C23F 4/00 216/22 |
| 2007/0069118 | A1 * | 3/2007 | Economou | H05H 3/02 250/251 |

* cited by examiner

ION BEAM ETCHING APPARATUS

CROSS-REFERENCE TO RELATED APPLICATIONS

This application claims the benefit under 335 U.S.C. § 119(a) of Korean Patent Application No. 10-2017-0095219 filed on Jul. 27, 2017 in the Korean Intellectual Property Office, the entire disclosure of which is incorporated herein by reference for all purposes.

BACKGROUND

1. Field

The following description relates to an ion-beam etching apparatus, and more particularly, to an ion-beam etching apparatus capable of controlling radicals in a multi-exhausting manner.

2. Description of Related Art

With the miniaturization and high integration of the semiconductor, dry etching using a plasma has gradually been adopted as a pattern etching method for finely patterning a semiconductor circuit. Plasma etching is a technique of generating a plasma and etching a target by reacting ions and radicals generated from the plasma with a target material. In plasma etching, ions move directionally downward and mainly anisotropically etch the material to be etched, while radicals are neutral particles that have no directionality but are very reactive and mainly isotropically etch the material to be etched.

Among the plasma dry etching methods, in reactive ion beam etching, the etching apparatus extracts and accelerates only ions from the plasma containing ions and radicals. Accelerated ions etch the material to be etched. This method has an advantage that it can efficiently perform precise etching. However, in the anisotropic etching only using ions, damage to the material to be etched, such as a memory material, does not occur. In the conventional ion beam etching process, exhaust operation is generally performed downward in the ion-beam etching apparatus. Thus, in addition to the ions contributing to the etching, the radicals also reach the surface of the material to be etched. Therefore, there is a disadvantage that the radicals react excessively to the wall surface pattern of the target material, thereby causing undesired etching by the radicals, or allowing diffusion of the radicals into the pattern. This may cause damage to the material to be etched. In particular, the penetration of the radicals into a pattern with the high aspect ratio at a tens of nanometers dimension may result in etching away of a portion which, otherwise, should not be etched. As a result, there is a problem of negatively affecting the device characteristics.

Therefore, there is an increasing demand for a new technique for controlling the radicals in a dry etching apparatus to perform a desired etching process.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

In one general aspect, an ion-beam etching apparatus includes: a plasma chamber configured to generate plasma from process gas in the plasma chamber; at least one plasma valve coupled to the plasma chamber; an ion-beam source in communication with the plasma chamber, wherein the ion-beam source is configured to extract ions from the plasma and generate ion-beams when a bias is applied to the ion-beam source; an etching chamber in communication with the ion-beam source, and configured to accommodate an object to be etched; at least one etching valve coupled to the etching chamber; and at least one exhausting pump connected to either one or both of the plasma chamber and the etching chamber by the plasma valve and the etching valve, respectively, wherein the at least one exhausting pump is configured to receive and exhaust radicals in either one or both of the plasma chamber and the etching chamber by the plasma valve and the etching valve, respectively.

The at least one exhausting pump may be connected to the plasma chamber and the etching chamber by the plasma valve and etching valve, respectively.

The plasma valve and the etching valve may be configured to control an amount of radicals exhausted from the plasma chamber and an amount of radicals exhausted from the etching chamber, respectively. A dominant exhaust path of the radicals may be determined based on comparison between the amount of radicals exhausted through the plasma valve and the amount of radicals exhausted through the etching valve.

When the amount of radicals exhausted through the plasma valve is larger than the amount of radicals exhausted through the etching valve, the dominant exhaust path of the radicals may be a path through the plasma valve. When the amount of radicals exhausted through the plasma valve is smaller than the amount of radicals exhausted through the etching valve, the dominant exhaust path of the radicals may be a path through the etching valve.

When the dominant exhaust path of the radicals is the path through the plasma valve and the bias is applied to the ion-beam source, the object may be etched by ion-beams. When the dominant exhaust path of the radicals is the path through the etching valve and the bias is not applied to the ion-beam source, the object may be cleaned using the radicals.

The etching chamber may include a shutter disposed under the ion-beam source and spaced apart from the object to cover the object. When the object is etched using the ion-beam, the shutter may be in an open state. When the object is cleaned using the radicals, the shutter may be in a closed state.

The plasma valve and the etching valve may each be configured to control an amount of radicals exhausted therethrough by controlling a degree of opening thereof.

The plasma chamber may include a plasma source configured to generate the plasma.

The plasma source may be a planar plasma source, and the plasma valve may be disposed on a lateral face of the plasma chamber. The plasma source may be a helical plasma source, and the plasma valve may be disposed on a top of the plasma chamber.

The at least one exhausting pump may include exhausting pumps, and each of the exhausting pumps may be a low-vacuum exhausting pump or a high-vacuum exhausting pump.

The at least one exhausting pump may include at least one low-vacuum exhausting pump and at least one high-vacuum exhausting pump.

The process gas may include any one or any combination of any two or more of a halogen-based gas, an inert gas, hydrogen, and oxygen. The halogen-based gas may include at least one selected from the group consisting of F, Cl, Br, I, HBr, ClF, ClF3, and OF2. The inert gas may include a gas containing at least one of group 18 elements.

The object may include a next generation memory semiconductor material including any one or any combination of any two or more of ferroelectric RAM (random access memory)(FeRAM), magnetic RAM (MRAM), phase change RAM (PRAM), resistance RAM (ReRAM), polymer RAM (PoRAM), nano-floating gate memory (NFGM), nanotube RAM, holographic memory, molecular electronic device, and a modular memory.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
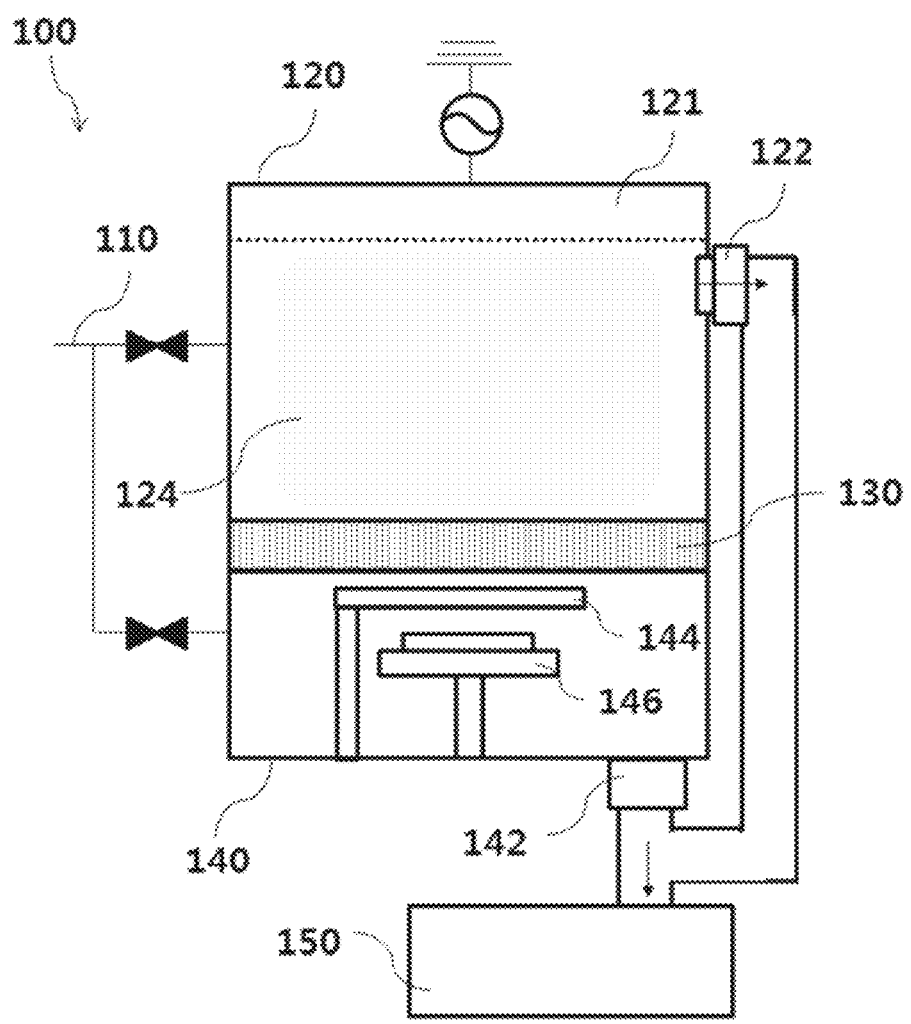
FIGS. 1A and 1B are views for illustrating an ion-beam etching apparatus, according to examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1B:
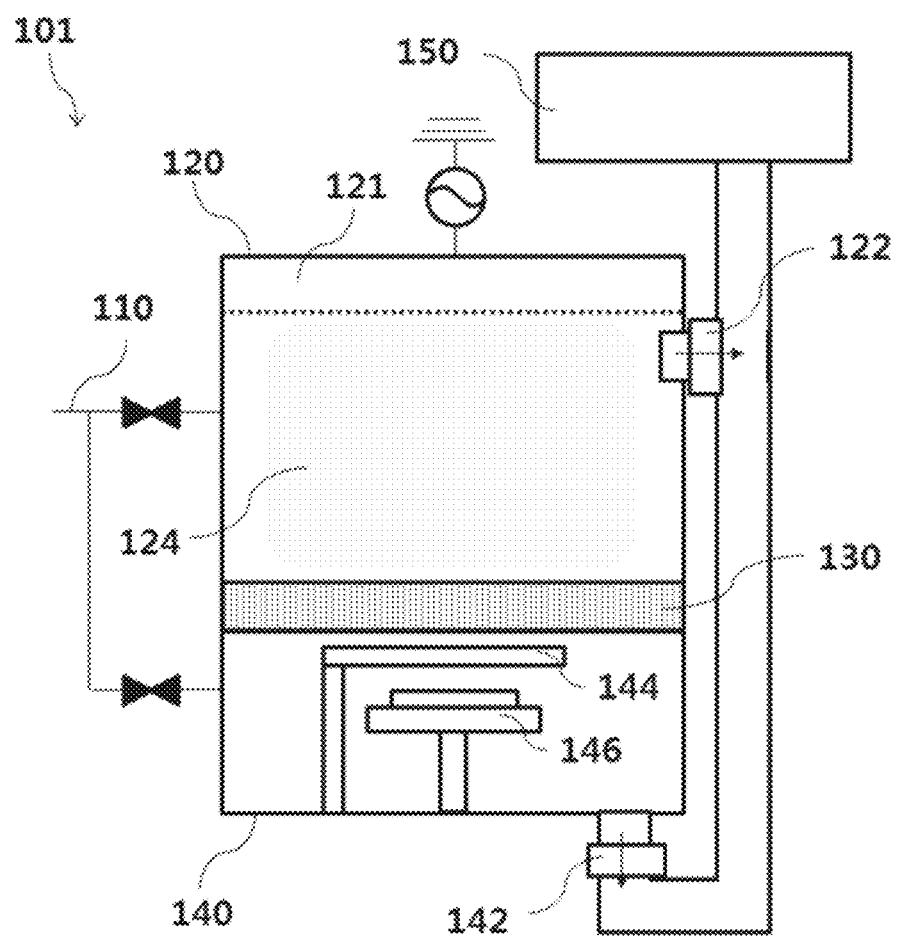

FIG. 1A and FIG. 1B are views illustrating the structure of ion-beam etching apparatuses 100 and 101, respectively, according to examples.

Referring to FIGS. 1A and 1B, the ion-beam etching apparatuses 100 and 101 each include: a plasma chamber 120 configured to generate plasma 124 from process gas therein, wherein the plasma chamber 120 has at least one plasma valve 122 coupled thereto; an ion-beam source 130 communicating with the plasma chamber 120, wherein the ion-beam source 130 is configured to extract ions from the plasma and generating ion-beams when a bias is applied to the ion-beam source 130, an etching chamber 140 communicating with the ion-beam source 130, wherein the etching chamber 140 has at least one etching valve 142 coupled thereto, and wherein the etching chamber 140 accommodates therein material to be etched; and at least one exhausting pump 150 connected via the plasma valve 122 and/or the etching valve 142 to the plasma chamber 120 and/or the etching chamber 140, wherein the pump 150 is configured to receive and exhaust radicals in the plasma chamber 120 and/or the etching chamber 140 via the plasma valve 122 and/or the etching valve 142.

The at least one exhausting pump 150 is connected to both the plasma chamber 120 and the etching chamber 140. The exhausting pump 150 may control the amount of radicals exhausted from the plasma chamber 120 and the etching chamber 140 via the plasma valve 122 and the etching valve 142, respectively. For example, when the ion-beam etching apparatuses 100 and 101 include one exhausting pump 150, the one exhausting pump 150 may be connected to both the plasma chamber 120 and the etching chamber 140, as shown in FIG. 1. Alternatively, when the ion-beam etching apparatuses 100 and 101 include a plurality of exhausting pumps 150, at least one pump of the plurality of exhausting pumps 150 may be connected to both the plasma chamber 120 and the etching chamber 140 to exhaust radicals from the chambers 120 and 140. More specific examples of the number and connection of the chambers and pumps will be described below with reference to the drawings.

In the ion-beam etching apparatuses 100 and 101 shown in FIGS. 1A and 1B, the plasma chamber 120, the ion-beam source 130, and the etching chamber 140 may be arranged downwardly in the described order, but the present disclosure is not limited to such a configuration. The plasma chamber 120, the ion-beam source 130, and the etching chamber 140 in the described order may be arranged in any direction. For example, in the ion-beam etching apparatuses 100 and 101, the etching chamber 140, the ion-beam source 130, and the plasma chamber 120 may be arranged in a downward direction in the described order (a direction reverse to that in FIGS. 1A and 1B). Alternatively, the etching chamber 140, the ion-beam source 130, and the plasma chamber 120 may be horizontally arranged in a left or right direction in the described order.

The plasma chamber 120 generates plasma 124 containing ions and radicals from the process gas injected through a gas inlet 110. The process gas may include any one or any combination of any two or more of a halogen-based gas, an inert gas, hydrogen, and oxygen. In an example, the halogen-based gas may include at least one of F, Cl, Br, I, HBr, ClF, $ClF_3$, and $OF_2$. The inert gas may be a gas containing at least one of Group 18 elements in a periodic table.

The plasma chamber 120 includes the plasma valve 122 connected to the exhausting pump 150. When the exhausting pump 150 is in an operating state, the pump 150 may exhaust atmosphere inside the plasma chamber 120 containing the radicals from the plasma chamber 120 through the plasma valve 122. The plasma valve 122 may be located between the plasma chamber 120 and the exhausting pump 150. In an example, the plasma valve 122 may be disposed directly on the plasma chamber 120. Alternatively, the valve 122 may be disposed between the plasma chamber 120 and the exhausting pump 150 through an exhaust pipe. The plasma valve 122 may be connected directly to the exhausting pump 150 or may be indirectly connected to the pump 150 through an exhaust pipe. In an example, when there are a plurality of exhausting pumps 150 connected to the plasma chamber 120, the plasma valve 122 may include a number of plasma valves corresponding to a number of exhausting pumps 150 connected to the plasma chamber 120. A more detailed example of the connection and number of the exhausting pumps 150 and the plasma valves 122 will be described below together with a more specific example of the exhausting pump.

The plasma valve 122 is configured to control the amount of radicals exiting the plasma chamber 120. For example, the plasma valve 122 may control the amount of exhausted radicals by finely adjusting a degree of opening of the plasma valve 122. The degree of opening of the plasma valve 122 may be a percentage of an opened portion therein. The degree of opening may be expressed as from 0% (non-opened, or closed) to 100% (fully open). The plasma valve 122 may be a valve capable of automatically, semi-automatically, or manually controlling the degree of opening. The pressure in the chamber 120 may be controlled according to the degree of opening or closing of the plasma valve 122. For example, when the plasma valve 122 is completely open, the pressure in the plasma chamber 120 may be lowered to a minimum value. On the other hand, when the plasma valve 122 is partially open, the pressure in the plasma chamber 120 may be relatively higher than the minimum value. The plasma valve 122 controls the pressure in the plasma chamber 120 by automatically, semi-automatically or manually controlling the degree of opening of the plasma valve 122 using an electrical signal or the like. As a result, it is possible to increase the efficiency of etching, cleaning, and pretreatment using the ion-beam etching apparatuses 100 and 101. More specific examples of etching, cleaning, and pretreatment using the ion-beam etching apparatuses 100 and 101 will be described later.

Further, the plasma chamber 120 includes a plasma source 121 for generating plasma. The plasma source 121 may be an induction coil that provides energy by applying power to the plasma chamber 120. In one example, the plasma source 121 may be a planar type source or a helical type source.

Figure 2A:
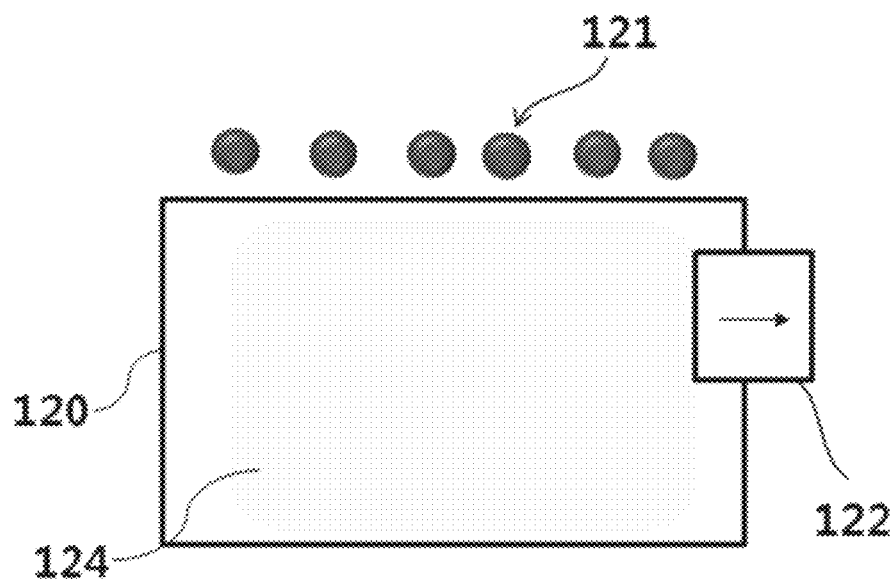
FIGS. 2A and 2B are views illustrating an ion-beam etching apparatus, according to examples.
Figure 2B:
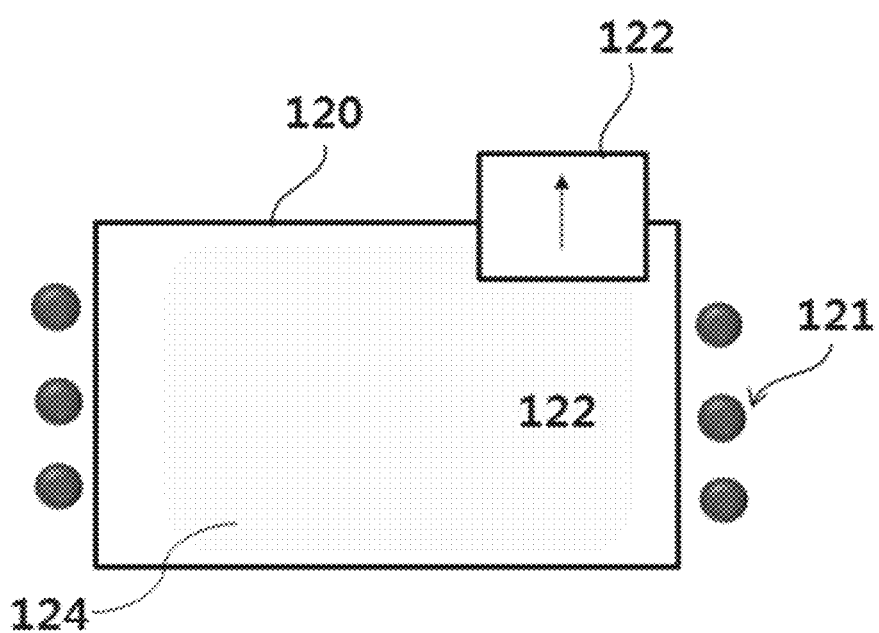

FIGS. 2A and 2B are views illustrating an ion-beam etching apparatus, according to examples.

More specifically, FIG. 2A illustrates a plasma chamber 120 having a planar plasma source 121, and FIG. 2B illustrates a plasma chamber having a helical plasma source 121.

Referring to FIGS. 2A and 2B in connection with FIGS. 1A and 1B, in an example, when the plasma source 121 is a planar source, as shown in FIG. 2A, the plasma valve 122 may be disposed on a lateral face of the plasma chamber 120 to exhaust radicals in a lateral direction from the plasma chamber 120. Alternatively, when the plasma source 121 is helical source, as shown FIG. 2B, the plasma valve 122 may be disposed in a top portion of the plasma chamber 120 to exhaust radicals in an upward direction from the plasma chamber 120.

Example arrangements of the plasma valve 122 according to the type of the plasma source 121 of the plasma chamber 120 are illustrated in FIGS. 2A and 2B. However, the disclosure is not limited to the illustrated examples.

Referring back to FIGS. 1A and 1B, the ion-beam source 130 communicates with the plasma chamber 120. When a bias is applied to the source 130, the ions may be extracted from plasma in the plasma chamber 120 by the ion-beam source 130 to generate ions-beams. The ion-beam source 130 is disposed between the plasma chamber 120 and the etching chamber 140. When a bias is applied to the ion-beam source 130, the ion-beam source 130 extracts and accelerates ions from the plasma chamber 120 and irradiates the ions-beam toward the etching chamber 140. In an example, the ion-beam source 130 may be in the form of a grid, but the disclosure is not limited to such an example. The ion-beam source 130 is not particularly limited as long as the ion-beam source 130 is capable of extracting and accelerating ions from the plasma chamber 120 to generate ions-beams.

The etching chamber 140 is in communication with the ion-beam source 130. The object to be etched is received in the etching chamber 140. The etching chamber 140 is provided with ions-beams generated from the ion-beam source 130 to etch the object to be etched therein. The object to be etched may be disposed on a substrate provided in the etching chamber 140. In an example, the object to be etched by the ion-beam etching apparatus 100/101 may include a next generation memory semiconductor material. The next-generation memory semiconductor material may include, but is not limited to, any one or any combination of any two or more of FeRAM (ferroelectric RAM (random access memory)), MRAM (Magnetic RAM), PRAM (Phase Change RAM), ReRAM (Resistance RAM), PoRAM (polymer RAM), nano-floating gate memory (NFGM), nanotube RAM, holographic memory, molecular electronic device, and a modular memory.

The etching chamber 140 includes an etching valve 142 connected to the exhausting pump 150. When the exhausting pump 150 is operated, the exhausting pump 150 may exhaust the inner atmosphere in the etching chamber 140 through the etching valve 142. The etching valve 142 may be located between the etching chamber 140 and the exhausting pump 150. The etching valve 142 may be located directly on the etching chamber 140. The etching valve 142 may alternatively be located between the etching chamber 140 and the exhausting pump 150 through an exhaust pipe. The etching valve 142 may be connected directly to the exhausting pump 150, or the etching valve 142 may be indirectly connected to the exhausting pump 150 through an exhaust pipe. Further, for example, when there are a plurality of exhausting pumps connected to the etching chamber 140, the etching valve 142 may include a plurality of etching valves corresponding to the number of the exhausting pumps connected to the etching chamber 140. A more detailed example of the number and connection of the etching valve 142 and the exhausting pump 150 will be described below together with a more specific example of the exhausting pump.

The etching valve 142 performs substantially the same function as the plasma valve 122 described above. Therefore, a detailed description overlapping with the description of the plasma valve 122 will be omitted. Hereinafter, the combination of the plasma valve 122 and the etching valve 142 will be more specifically exemplified.

The plasma valve 122 and the etching valve 142 may be configured to control the amount of radicals exhausted from the plasma chamber 120 and the etching chamber 140, respectively, by finely adjusting the degree of opening as illustrated referring to the plasma valve 122. That is, the ion-beam etching apparatuses 100 and 101 include at least two valves provided on the plasma chamber 120 and the etching chamber 140, respectively. Thus, exhaust of radicals from the plasma chamber 120, exhaust of radicals from the etching chamber 140, or exhaust of radicals from the plasma chamber 120 and the etching chamber 140 may all be performed. The dominant exhaust path of the radicals may be determined based on comparison between the amounts of radicals exhausted through the plasma valve 122 and the etching valve 142. In an example, when the amount of radicals exiting through the plasma valve 122 is dominant, the dominant exhaust path of the radicals may be the path through the plasma valve 122. To the contrary, when the amount of radicals exhausted through the etching valve 142 is dominant, the dominant exhaust path of the radicals may be a path through the etching valve 142.

The etching chamber 140 may include a shutter 144 disposed below the ion-beam source 130 and spaced apart from the object to be etched and covering the object to be etched. The shutter 144 may be in an ON/OFF state. The shutter 144 may be in an open state in an ON state and in a closed state in an OFF state. A more specific example of the shutter will be described later.

The ion-beam etching apparatuses 100 and 101 ion-beam-etch or clean the object to-be-etched based on the dominant exhaust path of the radicals, whether or not bias is applied to the ion-beam source 130, and/or on/off states of the shutter 144. A more detailed description of selection of etching or cleaning will be provided with reference to FIGS. 3A to 3C.

Figure 3A:
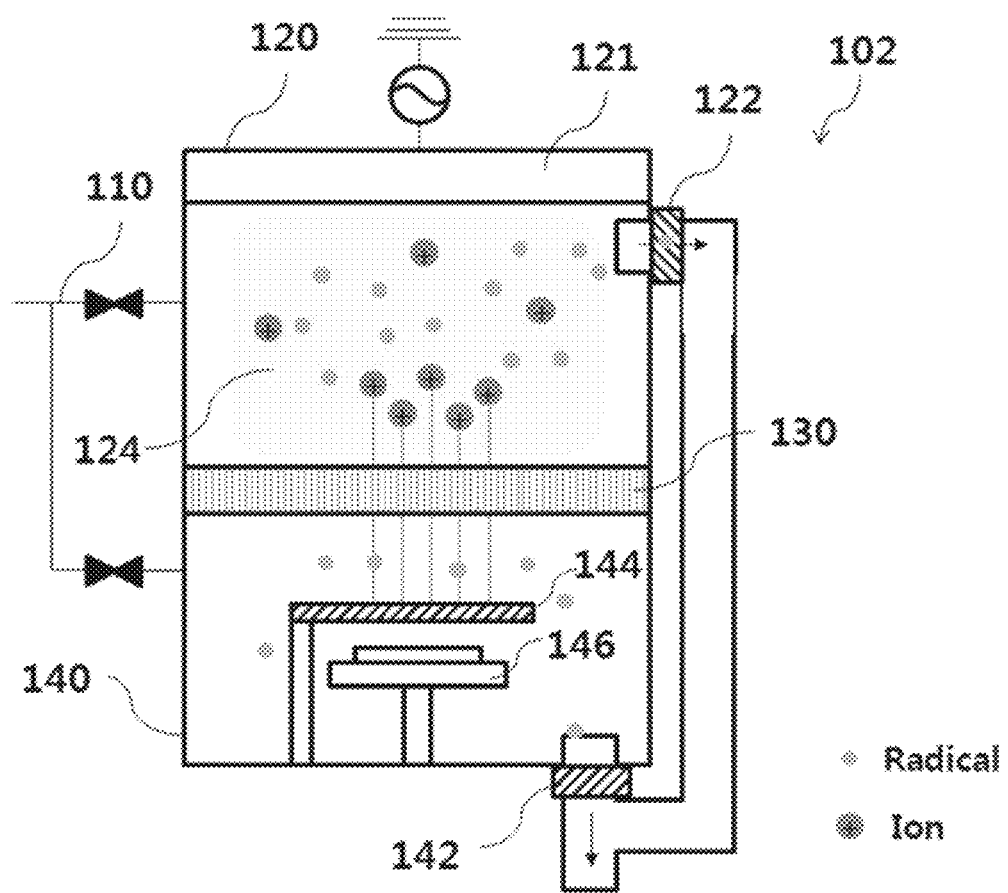
FIGS. 3A to 3C are views illustrating an ion-beam etching apparatus, according to examples.
Figure 3B:
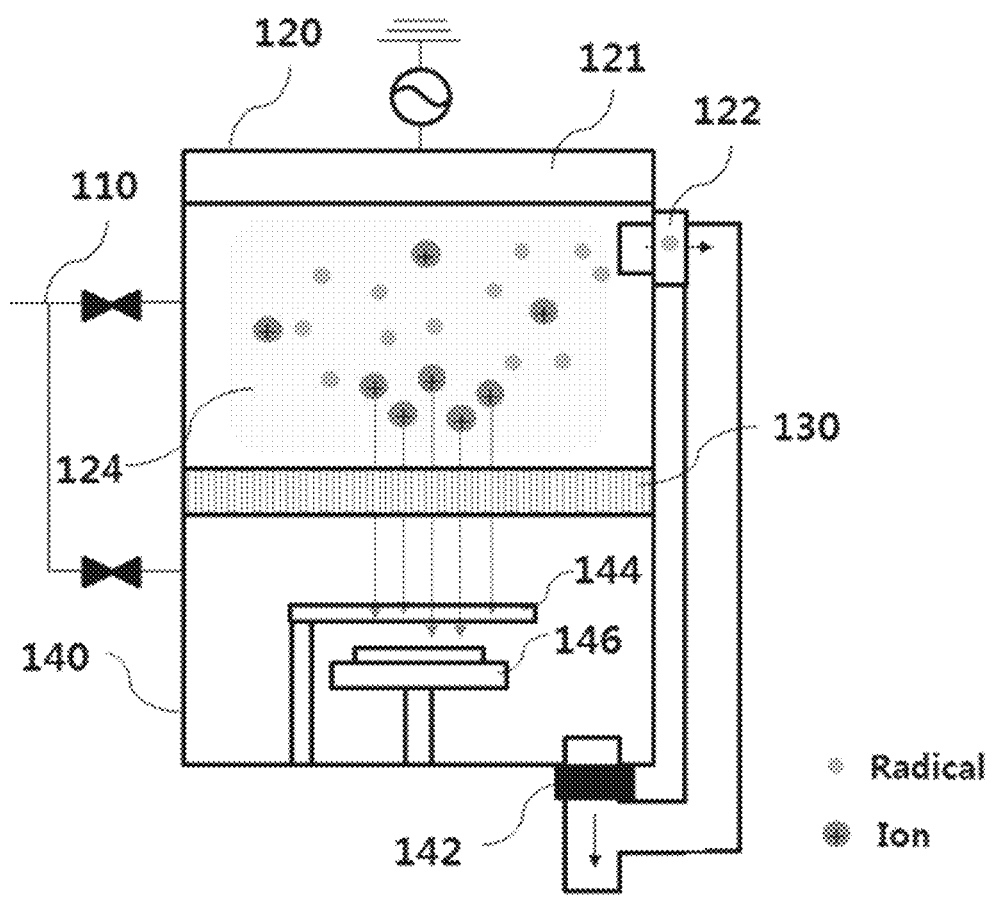
Figure 3C:
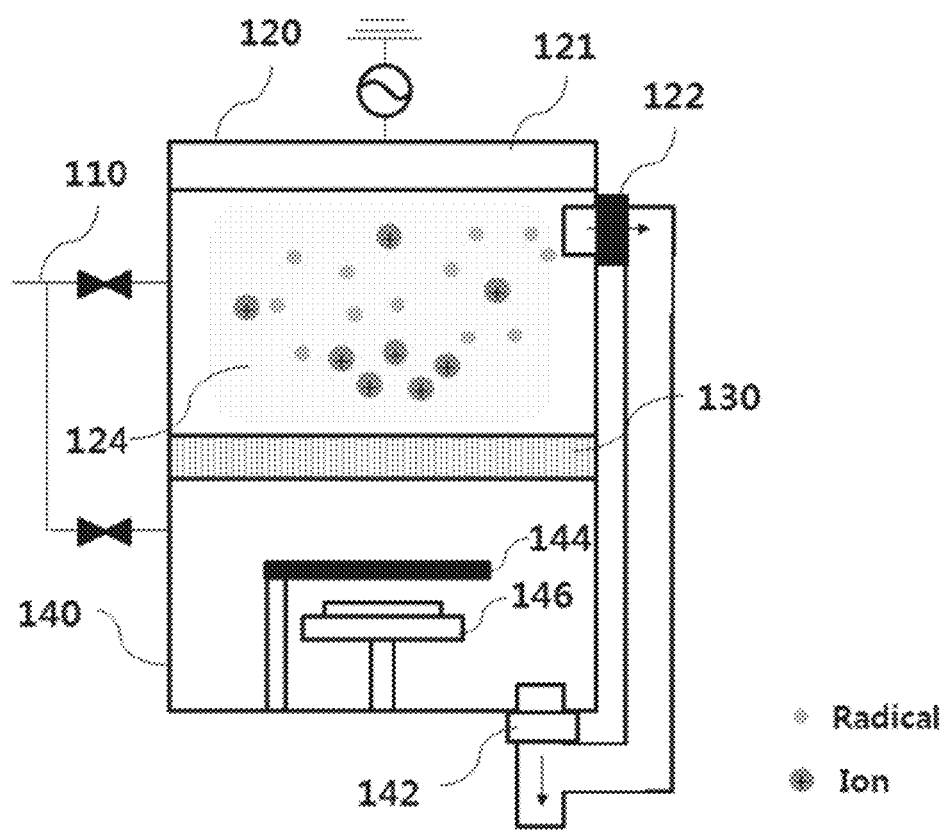

FIGS. 3A to 3C are views illustrating an ion-beam etching apparatus, according to an example.

FIG. 3A is a view illustrating the ion-beam etching process, according to an example. FIG. 3B is a view illustrating an ion-beam etching process, according to another example. FIG. 3C is a view illustrating radicals-cleaning, according to an example.

Referring to FIGS. 3A to 3C together with FIGS. 1A, 1B, 2A, and 2B, as shown in FIG. 3A, the ion-beam etching apparatus 102 may control amounts of ions and radicals reaching the object to be etched in the etching chamber 140 based on the dominant exhaust path of the radicals, whether or not bias is applied to the ion-beam source 130, on/off states of the shutter, and/or opening percentages of each of the plasma valve 122 and the etching valve 142. Thus, the object to be etched may be rapidly etched by appropriately adjusting the amounts of radicals and ions reaching the object to be etched. Etching performed by the ion-beam etching apparatus 102 may include both isotropic and anisotropic etching.

In an example, when the dominant exhaust path of the radicals is the path through the plasma valve 122 and when a bias is applied to the ion-beam source 130, the ions in the plasma chamber 120 are extracted and accelerated through the ion-beam source 130 and converted into ion-beams. Most of the radicals in the plasma chamber 120 may be exhausted through the plasma valve 122. Thus, the object to be etched may be stably etched while the object to be etched is protected from damage by radicals. When the plasma valve 122 is 100% open and the etching valve 142 is 0% open as shown in FIG. 3B, the radicals are exhausted to the path through the plasma valve 122, and thus are not transferred to the etching chamber 140. That is, the damage of the object to be etched by the radicals can be minimized. Therefore, it is possible to precisely and stably anisotropically etch the object to be etched. In this configuration, the shutter 144 may be in the on state.

Alternatively, as shown in FIG. 3C, when the plasma valve 122 is 0% open and the etching valve 142 is 100% open, the radicals are exited only through the path through the etching valve 142. In this configuration, when no bias is applied to the ion-beam source 130, the ion-beam source 130 does not extract and accelerate the ions in the plasma chamber 120. Thus, only radicals in the plasma chamber 120 may reach the object to be etched in the etching chamber 140 through the ion-beam source 130. In this example, the radicals reaching the object to be etched are adsorbed on the surface of the object to be etched. Then, the reactants formed from the adsorbed radicals may be removed to dry-clean the object to be etched. Thus, the surface of the object to be etched may be pretreated before the etching using the radicals; or the object to be etched may be dry-cleaned using the radicals reaching the object to be etched. Thereby, it is possible to remove foreign substances such as post-etching residues, metals, organic matters and natural oxides present on the surface of the object to be etched. When the radicals are adsorbed, the process gas may be selected depending on the kind of materials to be cleaned, and, then, the selected process gas may be injected through the gas inlet.

Further, removal of the reactants formed from the radicals may use ions extracted from the plasma. Alternatively, a separate lamp may be used to remove the reactants, for example, via light energy (ultraviolet light having a wavelength of 1 nm to 300 nm), electric energy (1 eV to 1000 eV when the light energy is converted to electric energy) or thermal energy (100° C. to 1000° C.) as generated from the lamp. In the above example, the reactants formed from the radicals are removed by using ions, light, or heat, for example. The disclosure is not limited to the foregoing examples. When the reaction product formed from the radicals may be removed by a method, the method is not particularly limited.

When the object to be etched is dry-cleaned using radicals, the radicals can remove foreign substances on the surface of the object to be etched without damaging the object to be etched. Thus, when the memory element or the like is etched in this manner, damage to the memory element is prevented, thereby contributing to the improvement of the performance of the memory element. When the object to be etched is radical-cleaned, the shutter 144 may be in the off state.

Thus, in other words, the ion-beam etching apparatus 102 controls the dominant exhaust path or bias application to control radicals and/or ion-beams reaching the object to be etched. Thus, the etching apparatus 102 may perform ion-beam etching or radical-cleaning of the object to be etched by controlling the amount of the radicals. Accordingly, a circulation process such as an etching-cleaning process or a cleaning-etching-cleaning process may be performed in a single apparatus by using the ion-beam etching apparatus 102.

Referring further to FIGS. 1A to 3C, the exhausting pump 150 is connected to the plasma chamber 120 and the etching chamber 140 through the plasma valve 122 and the etching valve 142, respectively. When the exhausting pump 150 is operated, the pump 150 may exhaust radicals from at least one of the plasma chamber 120 and the etching chamber 140 through the plasma valve 122 and the etching valve 142. The pressure applied to one valve adjacent to the exhausting pump 150 may be higher than the pressure to the other valve. Accordingly, the exhaust of the radicals through the one valve adjacent to the exhausting pump 150 may be further accelerated. Thus, the path through the one valve adjacent to the exhausting pump 150 may form the dominant exhaust path of the radicals. Thus, when the apparatus controls the radicals to perform ion-beam etching, the exhausting pump 150 may be positioned adjacent to the plasma valve 122 of the plasma chamber 120 (refer to FIG. 1B). Alternatively, when the apparatus performs radicals-cleaning via controlling the ion-beam, the exhausting pump 150 may be disposed adjacent to the etching valve 142 of the etching chamber 140 (refer to FIG. 1A). Although a particular position of the exhausting pump 150 is illustrated above, the disclosure is not limited to this example.

In accordance with this disclosure, the ion-beam etching apparatuses 100, 101, and 102 include at least one exhausting pump 150. The at least one exhausting pump 150 may independently be a low-vacuum exhausting pump or a high-vacuum exhausting pump. The low-vacuum exhausting pump is an exhausting pump configured to generate low-vacuum in the ion-beam etching apparatus. The high-vacuum exhausting pump is an exhausting pump configured to generate high-vacuum in the ion-beam etching apparatus. For example, the low-vacuum exhausting pump may include a rotary exhausting pump, while the high-vacuum exhausting pump may include a turbo-molecular exhausting pump.

In an example, when there two or more exhausting pumps 150, the two or more exhausting pumps each may independently be a low-vacuum exhausting pump or a high-vacuum exhausting pump. In this configuration, the exhausting pumps 150 may be connected to each other via a pump valve 152. The pump valve 152 is a valve positioned between a first exhausting pump and a second exhausting pump. The pump valve 152 may be a valve that performs substantially the same function as the plasma valve 122 and the etching valve 142. The pump valve 152 is located between the first exhausting pump and the second exhausting pump through an exhaust pipe, and may connect the first and second exhausting pumps.

Figure 4:
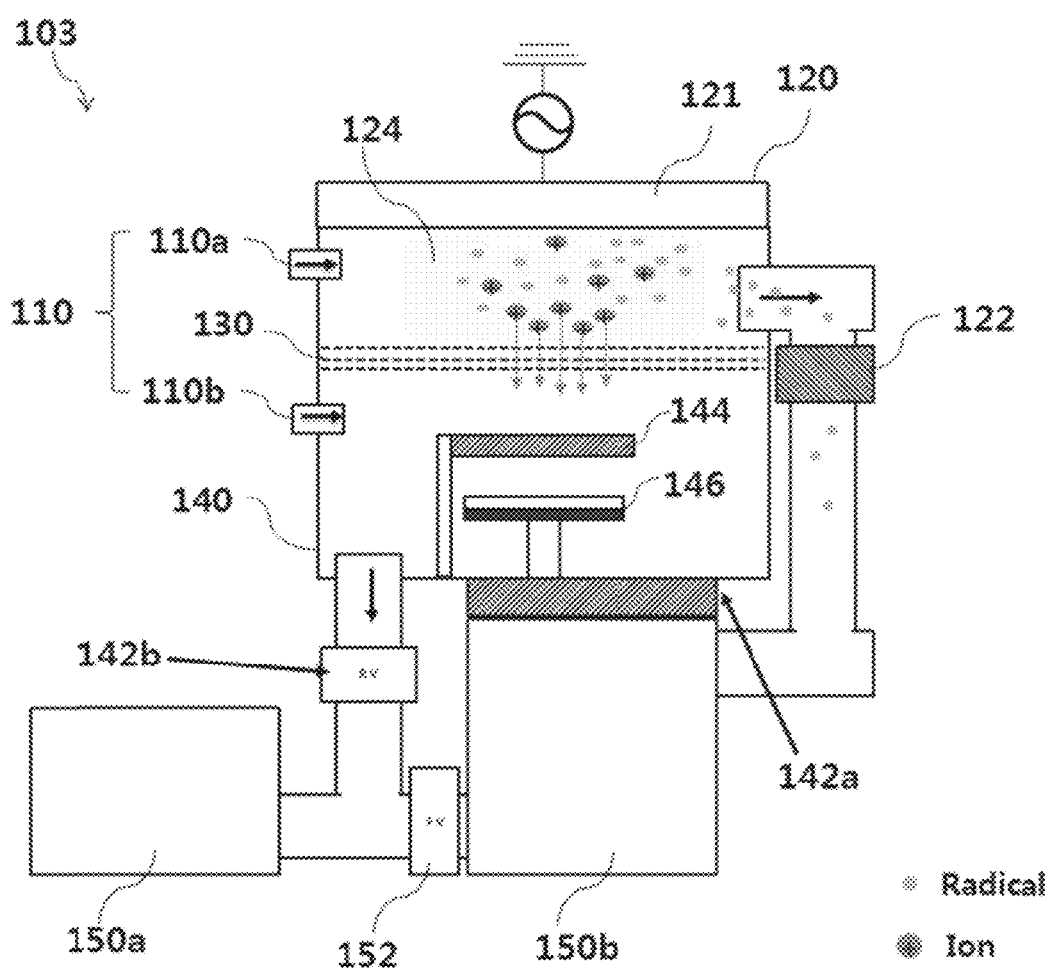
FIG. 4 is a view illustrating an ion-beam etching apparatus, according to an example.

Referring to FIG. 4, an ion-beam etching apparatus e including a plurality of exhausting pumps, according to an example, will be described.

FIG. 4 is a view illustrating an ion-beam etching apparatus 103, according to an example.

Referring to FIG. 4, the ion-beam etching apparatus 103 includes, for example, a first exhausting pump 150a and a second exhausting pump 150b connected to the first exhausting pump 150a. The first exhausting pump 150a and the second exhausting pump 150b are connected to each other through a pump valve 152. Further, the first exhausting pump 150a and the second exhausting pump 150b may be connected to either one or both of the plasma chamber 120 and the etching chamber 140 through the plasma valve 122 and etching valve 142 provided in the plasma chamber 120 and the etching chamber 140, respectively. Either one or both of the exhausting pumps 150a and 150b may be connected to both the plasma chamber 120 and the etching chamber 140, and may control the amounts of radicals exiting the plasma chamber 120 and the etching chamber 140, respectively. In an example, when each of the first exhausting pump 150a and the second exhausting pump 150b is connected to both the plasma chamber 120 and the etching chamber 140, each of the plasma chamber 120 and the etching chamber 140 may have two plasma valves and two etching valves, and is connected to both of the first exhausting pump 150a and the second exhausting pump 150b through the respective two valves to exhaust the radicals.

Alternatively, in FIG. 4, the second exhausting pump 150b is connected to the etching chamber 140 by second etching valve 142B. The first exhausting pump 150a is connected to both the plasma chamber 120 and the etching chamber 140. When the second exhausting pump 150b is connected to one of the plasma chamber 120 and the etching chamber 140, the chamber connected to the second exhausting pump 150b may include two etching valves (first and second etching valves) connected to the first exhausting pump 150a and the second exhausting pump 150b, respectively. In this configuration, the first exhausting pump 150a and the second exhausting pump 150*b* may each independently be a low-vacuum exhausting pump or a high-vacuum exhausting pump.

Further, in one example, when the ion-beam etching apparatus 103 of the present disclosure includes a plurality of exhausting pumps 150, the ion-beam etching apparatus 103 may include at least one low-vacuum exhausting pump and at least one high-vacuum exhausting pump. Specifically, the ion-beam etching apparatus 103 of the present disclosure has at least one low-vacuum exhausting pump and at least one high-vacuum exhausting pump. Thereby, when the low-vacuum is required, low-vacuum may be generated via the low-vacuum exhausting pump. Alternatively, when high-vacuum is required, the low-vacuum exhausting pump generates low-vacuum, and, then, the high-vacuum exhausting pump may generate high-vacuum from the previously generated low-vacuum. The high-vacuum exhausting pump to generate the high-vacuum requires a high energy and a long time to generate the high-vacuum at an atmospheric pressure, in the absence of the low exhausting pump. However, when the apparatus 103 includes the low-vacuum exhausting pump to generate the low-vacuum together with the high-vacuum exhausting pump, it is easy to generate the high-vacuum by first creating the low-vacuum and then creating the high-vacuum from the previously generated low-vacuum.

Therefore, when the high-vacuum is required, the ion-beam etching apparatus 103 including the at least one low-vacuum exhausting pump and the at least one high-vacuum exhausting pump may facilitate the high-vacuum environment. Accordingly, when the ion-beam etching apparatus 103 includes at least one low-vacuum exhausting pump and at least one high-vacuum exhausting pump, the ion-beam etching apparatus 103 may easily generate the low-vacuum or high-vacuum based on the required degree of vacuum for the desired etching, cleaning, and pretreatment. Thus, the ion-beam etching apparatus 103 may include the at least one low-vacuum exhaustion pump and at least one high-vacuum exhaustion pump.

According to the ion-beam etching apparatuses disclosed herein, each of the plasma chamber and the etching chamber is connected to the exhausting pump, and the amount of radicals exhausted from each chamber may be controlled by the valves. Thereby, the amount of radicals exhausted from each chamber may be controlled to control the amount of radicals reaching the material to be etched.

Further, since the ions (ion-beams) supplied to the material to be etched can be controlled, the ion-beam etching apparatus may control the ions and/or radicals such that the target may be etched more precisely.

Further, the disclosed ion-beam etching apparatuses may control the amount of radicals reaching the material to be etched, thereby preventing damage to the material to be etched due to unwanted radical reactions or diffusion. Thus, when the memory element is etched, the performance of the memory element may be prevented from being diminished.

According to this disclosure, the ion-beam etching apparatuses etch the object to be etched by controlling the ions and/or radicals using a multi-exhaust scheme. By controlling ions and/or radicals, it is possible to precisely perform the ion-beam etching process while preventing damage to or unnecessary etching of the material to be etched. Accordingly, it is possible to precisely pattern the highly integrated and miniaturized memory semiconductor device without damaging the memory semiconductor device.

Further, according to this disclosure, in the same single ion-beam etching apparatus, the radicals (dry)-cleaning may remove the foreign substances on the surface of the material to be etched. Thus, since the circulation processes such as etching-cleaning or cleaning-etching-cleaning may be performed in the single ion-beam etching apparatus, the ion-beam etching apparatus improves etching efficiency by performing pre-treatment of the material to be etched, prior to etching or by removing the residue after etching.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An ion-beam etching apparatus, comprising:
    a plasma chamber configured to generate plasma from process gas in the plasma chamber;
    a plasma valve coupled to the plasma chamber;
    an ion-beam source in communication with the plasma chamber, wherein the ion-beam source is configured to extract ions from the plasma and generate ion-beams when a bias is applied to the ion-beam source;
    an etching chamber in communication with the ion-beam source, and configured to etch an object using the ion-beams when the bias is applied to the ion-beam source and clean the object using radicals when the bias is not applied to the ion-beam source;
    first and second etching valves respectively coupled to the etching chamber; and
    first and second exhausting pumps connected to each other through a pump valve,
    wherein the first and second exhausting pumps are connected to the etching chamber through the first and second etching valves, respectively, the first exhausting pump is connected to the plasma chamber through the pump valve and the plasma value, and the second exhausting pump is connected to the plasma chamber through the plasma valve,
    wherein each exhausting pump is configured to receive and exhaust radicals in either one or both of the plasma chamber and the etching chamber by the plasma valve and the etching valves, respectively, and
    wherein the plasma valve and the etching valves each are configured to control a degree of opening thereof to control an amount of radicals exhausted from each valve, and the degree of opening of the plasma valve is larger than that of the etching valves when the object is etched, and the degree of opening of the plasma valve is smaller than that of the etching valves when the object is cleaned.

2. The apparatus of claim 1, wherein each of the exhausting pumps is a low-vacuum exhausting pump when the second exhausting pump is connected to one of the plasma chamber and the etching chamber.

3. The apparatus of claim 1, wherein a dominant exhaust path of the radicals is determined based on comparison between an amount of radicals exhausted through the plasma valve and an amount of radicals exhausted through the etching valve.

4. The apparatus of claim 3, wherein, when the amount of radicals exhausted through the plasma valve is larger than the amount of radicals exhausted through the etching valve, the dominant exhaust path of the radicals is a path through the plasma valve, and wherein, when the amount of radicals exhausted through the plasma valve is smaller than the amount of radicals exhausted through the etching valve, the dominant exhaust path of the radicals is a path through the etching valve.

5. The apparatus of claim 4, wherein, when the dominant exhaust path of the radicals is the path through the plasma valve and the bias is applied to the ion-beam source, the object is etched by ion-beams, and wherein, when the dominant exhaust path of the radicals is the path through the etching valve and the bias is not applied to the ion-beam source, the object is cleaned using the radicals.

6. The apparatus of claim 5, wherein the etching chamber comprises a shutter disposed under the ion-beam source and spaced apart from the object to cover the object, wherein, when the object is etched using the ion-beams, the shutter is configured to be in an open state, and wherein when the object is cleaned using the radicals, the shutter is configured to be in a closed state.

7. The apparatus of claim 1, wherein when the object is cleaned using the radicals, the degree of opening of the plasma valve is 0% and the degree of opening of the etching valve is 100%.

8. The apparatus of claim 5, wherein the plasma chamber comprises a plasma source configured to generate the plasma.

9. The apparatus of claim 8, wherein the plasma source is a planar plasma source, and the plasma valve is disposed on a lateral face of the plasma chamber, or the plasma source is a helical plasma source, and the plasma valve is disposed on a top of the plasma chamber.

10. The apparatus of claim 1, wherein each of the exhausting pumps is high-vacuum exhausting pump when the second exhausting pump is connected to one of the plasma chamber and the etching chamber.

11. The apparatus of claim 1, wherein the first and second exhausting pumps comprise a low-vacuum exhausting pump and a high-vacuum exhausting pump.

12. The apparatus of claim 1, wherein the process gas comprises any one or any combination of any two or more of a halogen-based gas, an inert gas, hydrogen, and oxygen, wherein the halogen-based gas comprises at least one selected from the group consisting of F, Cl, Br, I, HBr, ClF, $ClF_3$, and $OF_2$, and wherein the inert gas comprises a gas containing at least one of group 18 elements.

13. The apparatus of claim 1, wherein the object comprises a next generation memory semiconductor material comprising any one or any combination of any two or more of ferroelectric RAM (random access memory)(FeRAM), magnetic RAM (MRAM), phase change RAM (PRAM), resistance RAM (ReRAM), polymer RAM (PoRAM), nano-floating gate memory (NFGM), nanotube RAM, holographic memory, molecular electronic device, and a modular memory.

* * * * *